(12) United States Patent
Li

(10) Patent No.: US 11,821,937 B2
(45) Date of Patent: Nov. 21, 2023

(54) SEMICONDUCTOR BASE PLATE AND TEST METHOD THEREOF

(71) Applicant: CHANGXIN MEMORY TECHNOLOGIES, INC., Hefei (CN)

(72) Inventor: Qiang Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/647,736

(22) Filed: Jan. 12, 2022

(65) Prior Publication Data
US 2023/0046754 A1 Feb. 16, 2023

Related U.S. Application Data

(63) Continuation of application No. PCT/CN2021/113082, filed on Aug. 17, 2021.

(30) Foreign Application Priority Data

Aug. 12, 2021 (CN) .......................... 202110925056.8

(51) Int. Cl.
*H01L 21/66* (2006.01)
*H01L 27/02* (2006.01)
(Continued)

(52) U.S. Cl.
CPC .......... *G01R 31/2644* (2013.01); *H01L 22/14* (2013.01); *H01L 22/32* (2013.01); *H01L 23/5384* (2013.01); *H01L 23/5386* (2013.01)

(58) Field of Classification Search
CPC .......... H01L 22/32; H01L 22/34; H01L 22/14; H01L 23/5283
See application file for complete search history.

(56) References Cited

U.S. PATENT DOCUMENTS 5,780,918 A * 7/1998 Aoki .................... H01L 23/5256
 438/467
5,981,302 A 11/1999 Alswede et al.
(Continued)

FOREIGN PATENT DOCUMENTS

CN 1199925 A 11/1998
CN 108573890 A 9/2018
(Continued)

OTHER PUBLICATIONS

International Search Report and English Translation cited in PCT/CN2021/113082 dated May 7, 2022, 7 pages.
(Continued)

*Primary Examiner* — Anthony Ho
*Assistant Examiner* — David J Goodwin
(74) *Attorney, Agent, or Firm* — Cooper Legal Group, LLC

(57) ABSTRACT

The embodiments of the present disclosure provide a semiconductor base plate and a test method thereof. When a first test line and a second test line in the semiconductor base plate are tested, a resistivity of the first test line can be tested by directly loading voltages to a first test pad and a second test pad after a first conductive layer is formed and before a first insulating layer is formed. After a second conductive layer is formed, a resistivity of the second test line is tested by loading voltages to a third test pad and a fourth test pad.

13 Claims, 4 Drawing Sheets

(51) Int. Cl.
      *H01L 27/06*     (2006.01)
      *G01R 31/26*     (2020.01)
      *H01L 23/538*    (2006.01)

(56) References Cited

U.S. PATENT DOCUMENTS

| | | | |
|---|---|---|---|
| 10,796,061 B1 | 10/2020 | Schultz | |
| 11,119,146 B1* | 9/2021 | Chong | H01L 22/14 |
| 2005/0051902 A1 | 3/2005 | Okajima | |
| 2006/0066337 A1* | 3/2006 | Kang | H01L 22/32 |
| | | | 324/750.11 |
| 2008/0242104 A1* | 10/2008 | Honma | G03F 1/44 |
| | | | 438/746 |
| 2018/0012814 A1* | 1/2018 | Zhan | H01L 29/6609 |
| 2020/0294871 A1* | 9/2020 | Shu | H01L 22/34 |

FOREIGN PATENT DOCUMENTS

| | | |
|---|---|---|
| CN | 110957300 A | 4/2020 |
| CN | 111679170 A | 9/2020 |
| KR | 20100013935 A | 2/2010 |

OTHER PUBLICATIONS

Written Opinion and English Translation cited in PCT/CN2021/113082 dated May 7, 2022, 6 pages.

* cited by examiner

SEMICONDUCTOR BASE PLATE AND TEST METHOD THEREOF

CROSS-REFERENCE TO RELATED APPLICATIONS

This is a continuation of International Application No. PCT/CN2021/113082, filed on Aug. 17, 2021, which claims the priority to Chinese Patent Application No. 202110925056.8, titled "SEMICONDUCTOR BASE PLATE AND TEST METHOD THEREOF" and filed with the China National Intellectual Property Administration (CNIPA) on Aug. 12, 2021. The entire contents of International Application No. PCT/CN2021/113082 and Chinese Patent Application No. 202110925056.8 are incorporated herein by reference.

TECHNICAL FIELD

The present disclosure relates to the technical field of semiconductors, and in particular to a semiconductor base plate and a test method thereof.

BACKGROUND

With increasing requirements on high-capacity semiconductor memory devices, the integration density of the semiconductor memory devices attracts wide attention. To increase the integration density of the semiconductor memory devices, a self-aligned double patterning (SADP) process can be adopted to form semiconductor devices and integrated circuits with fine patterns or high integration beyond restriction of lithography equipment.

SUMMARY

According to some embodiments, a first aspect of the present disclosure provides a semiconductor base plate, including:
a semiconductor substrate, including a test region;
a first conductive layer, located in the test region of the semiconductor substrate, wherein the first conductive layer includes a first test structure and a second test line arranged at intervals from each other; and the first test structure includes a first test pad and a second test pad arranged at intervals, and a first test line electrically connected between the first test pad and the second test pad;
a first insulating layer, located on a side of the first conductive layer away from the semiconductor substrate; and
a second conductive layer, located on a side of the first insulating layer away from the semiconductor substrate, wherein the second conductive layer includes a third test pad and a fourth test pad;
wherein the third test pad is electrically connected to a first terminal of the second test line through a first via hole, and the fourth test pad is electrically connected to a second terminal of the second test line through a second via hole; and
the first via hole and the second via hole penetrate the first insulating layer.

According to some embodiments, a second aspect of the present disclosure provides a method of testing the semiconductor base plate, including:
after forming the first conductive layer in the test region of the semiconductor substrate, and before forming the second conductive layer in the test region of the semiconductor substrate, determining a resistivity of the first test line by loading different voltages to the first test pad and the second test pad through a test machine; and
after forming the second conductive layer in the test region of the semiconductor substrate, determining a resistivity of the second test line by loading different voltages to the third test pad and the fourth test pad through the test machine.

DETAILED DESCRIPTION

Figure 1:
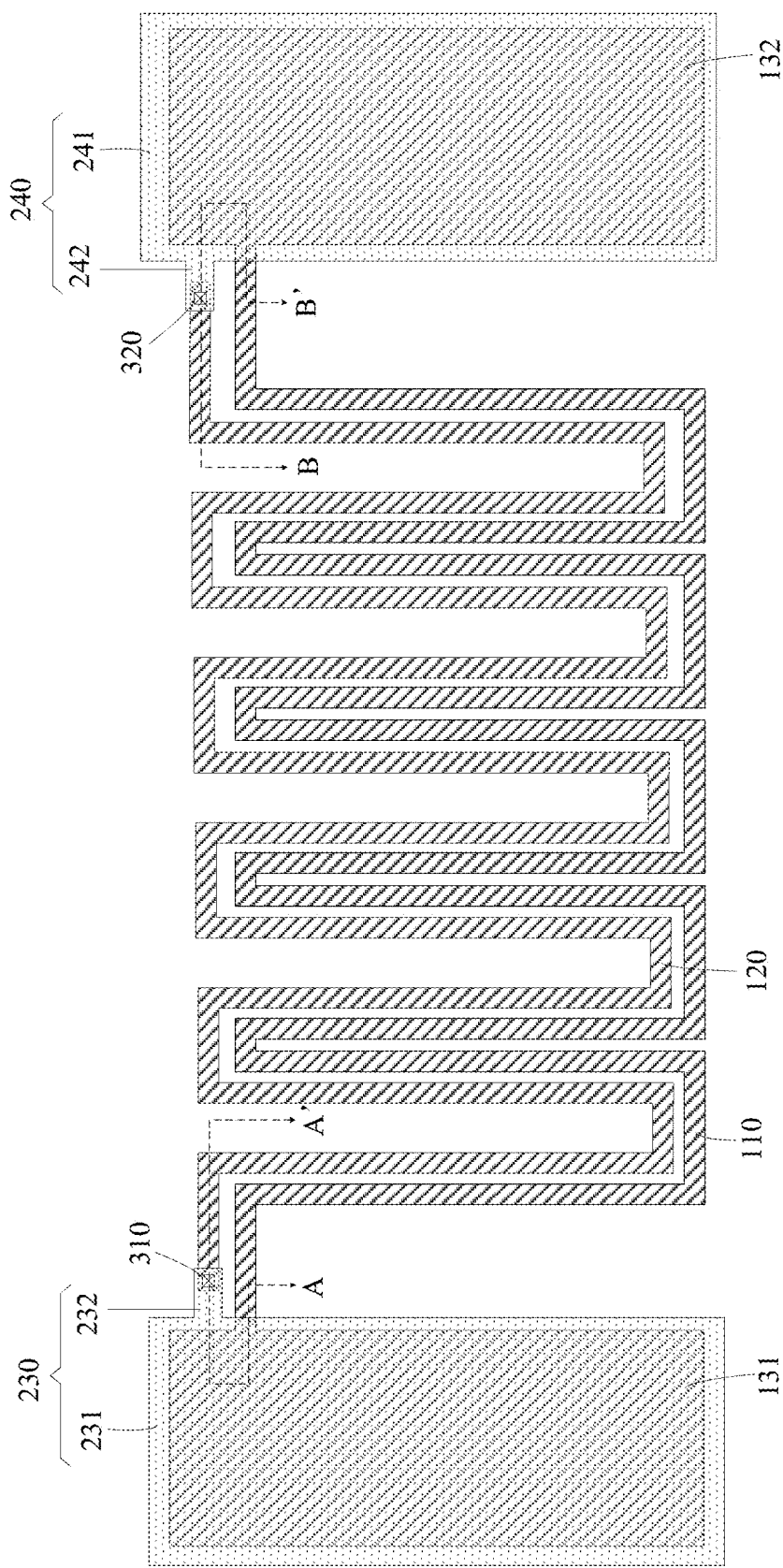
FIG. 1 is a top view structure diagram of a semiconductor base plate in the embodiments of the present disclosure.
Figure 2A:
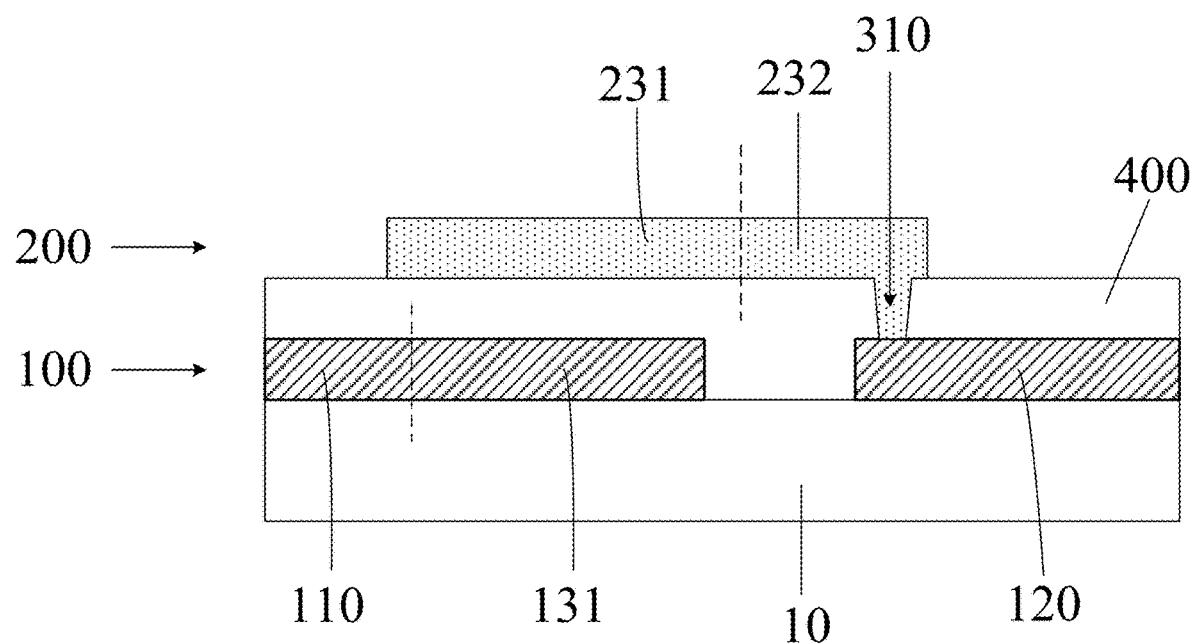
FIG. 2A is a section view structure diagram of the semiconductor base plate as shown in FIG. 1 along an AA' direction in the embodiments of the present disclosure.
Figure 2B:
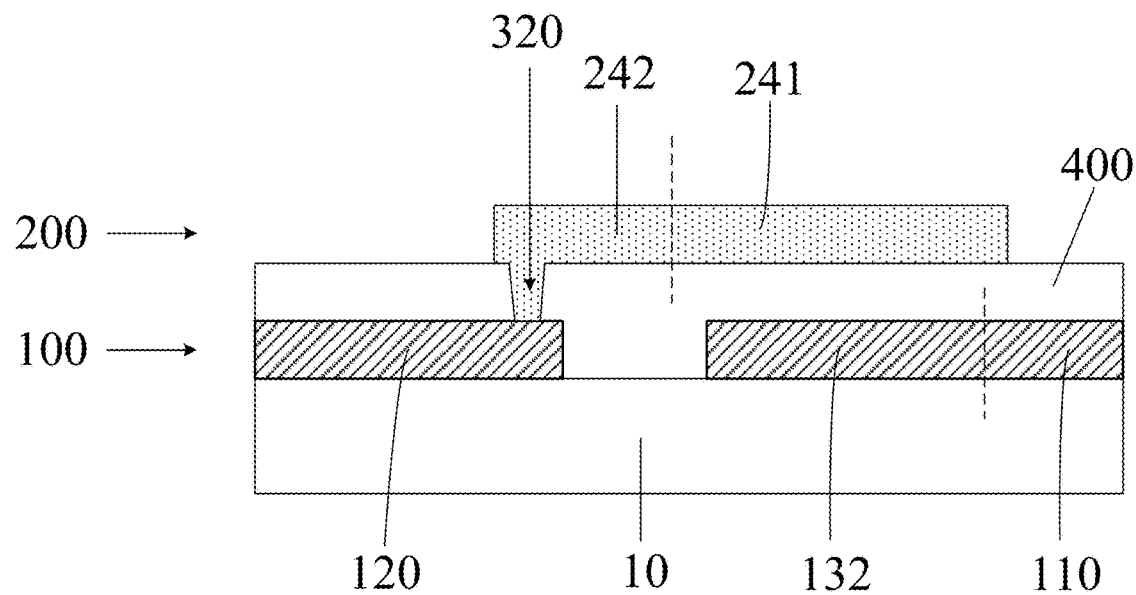
FIG. 2B is a section view structure diagram of the semiconductor base plate as shown in FIG. 1 along a BB' direction in the embodiments of the present disclosure.

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some rather than all of the embodiments of the present disclosure. Without conflict, the embodiments in the present disclosure and features in the embodiments may be combined with each other. All other embodiments obtained by those of ordinary skill in the art based on the described embodiments of the present disclosure without creative efforts should fall within the protection scope of the present disclosure.

Unless otherwise defined, the technical or scientific terms used in the present disclosure are to be given their ordinary meanings as understood by those of ordinary skill in the art to which the present disclosure belongs. The "first", "second" and similar words used in the present disclosure do not denote any order, quantity, or importance, but rather are used to distinguish different components. The "comprise" or "include" and similar words mean that the elements or items appearing before the words encompass the elements or items listed after the words and their equivalents, but do not exclude other elements or items. The "connecting" or "connected" and similar words are not restricted to physical or mechanical connections, but may include electric connections, whether direct or indirect.

It should be noted that the sizes and shapes of the figures in the drawings do not reflect true scales, and are intended merely to illustrate the contents of the present disclosure. The same or similar reference numerals represent the same or similar elements or elements having the same or similar functions throughout the specification.

In the embodiments of the present disclosure, referring to FIGS. 1-4B, a semiconductor base plate may include a semiconductor substrate 10. Exemplarily, a material of the semiconductor substrate 10 may include silicon, germanium, or silicon-on-insulator (SOI), or include germanium silicon compound, silicon carbide or other known materials, for example, III and V compounds such as gallium arsenide and the like. Certain doped ions may also be implanted into the semiconductor substrate 10 according to design requirements to change electric parameters. Exemplarily, the semiconductor substrate 10 may be a silicon substrate.

In the embodiments of the present disclosure, referring to FIGS. 1-4B, the semiconductor substrate 10 may include an array region and a periphery region. The array region may include a memory unit, a word line and a bit line, and the memory unit includes a memory transistor and a memory columnar capacitor. And, the periphery region may include a circuit region and a test region. Wherein the circuit region may include some control circuits, protection circuits (for example, fuse devices) and the like.

In the embodiments of the present disclosure, referring to FIGS. 1-4B, the test region may include a first conductive layer 100 located on the semiconductor substrate 10, a first insulating layer 400 located on a side of the first conductive layer 100 away from the semiconductor substrate 10, and a second conductive layer 200 located on a side of the first insulating layer 400 away from the semiconductor substrate 10. Materials of the first conductive layer 100 and the second conductive layer 200 may be metal materials.

In the embodiments of the present disclosure, referring to FIGS. 1-4B, a self-aligned double patterning (SADP) process may be adopted to form figures of structures located in the first conductive layer 100 in the array region, and form figures of structures located in the first conductive layer 100 in the test region. Exemplarily, in the test region, the first conductive layer 100 may include a first test structure and a second test line 120 arranged at intervals from each other; and the first test structure includes a first test pad 131 and a second test pad 132 arranged at intervals, and a first test line 110 electrically connected between the first test pad 131 and the second test pad 132. In some examples, in the array region, a memory transistor is prepared first, then a memory columnar capacitor is prepared, and then the first conductive layer 100 is prepared. Exemplarily, the first conductive layer 100 may include some signal lines (for example, a capacitor lead line connected with a common electrode of the memory columnar capacitor). Exemplarily, corresponding test lines may be formed in the test region when the SADP process is adopted to form figures of the signal lines in the array region, so as to obtain square resistances of the figures through the test lines. For example, the signal lines in the array region in the first conductive layer 100 and the first test structure and the second test line 120 may be formed simultaneously by the SADP process.

In the embodiments of the present disclosure, referring to FIGS. 1-4B, by the SADP process, signal lines located in the first conductive layer 100 may be formed in the array region, and figures of the first test structure and the second test line 120 located in the first conductive layer 100 may be formed in the test region. After the figures of the structures in the first conductive layer 100 are formed, different voltages may be loaded to the first test pad 131 and the second test pad 132 through a test machine, to determine resistivity of the first test line 110. As different voltages are loaded to the first test pad 131 and the second test pad 132, a current may be generated between the first test pad 131 and the second test pad 132, and the current flows through the first test line 110, such that the resistivity of the first test line 110 may be obtained according to the current.

Exemplarily, a first current flowing through the first test line 110 may be obtained by loading a first voltage to the first test pad 131 and loading a second voltage to the second test pad 132 through the test machine. Wherein, the first voltage may be smaller than the second voltage. For example, the first voltage may be 0V, and the second voltage is a positive value (for example, 5V). The test machine may directly read the first current. Certainly, in practical application, the specific values of the first voltage and the second voltage may be set according to requirements of application, without limitation here.

Thus, the resistivity ρ1 of the first test line 110 may be determined through formulas $$Rm1 = \frac{V2 - V1}{I1} \text{ and } \rho1 = \frac{Rm1 * S1}{L1}$$

according to the first voltage, the second voltage and the first current. Wherein Rm1 represents a first test resistance, V1 represents the first voltage, V2 represents the second voltage, I1 represents the first current, ρ1 represents the resistivity of the first test line 110, S1 represents a cross section area of the first test line 110, and L1 represents a length of the first test line 110. It should be noted that, the cross section area and the length of the first test line 110 may be obtained according to a preparation process.

In the embodiments of the present disclosure, referring to FIGS. 1-4B, the first insulating layer 400 is formed on the side of the first conductive layer 100 away from the semiconductor substrate 10, and covers the array region and the test region, to protect the first conductive layer 100 through the first insulating layer 400. By a photolithography process and an etching process, a first via hole 310 and a second via hole 320 may be formed in a part of the first insulating layer 400 located in the test region, for signal lapping. Certainly, signal lapping may also be required in the array region, such that via holes may also be formed in a part of the first insulating layer 400 located in the array region by the photolithography process and the etching process.

In the embodiments of the present disclosure, referring to FIGS. 1-4B, the second conductive layer 200 is formed on the side of the first insulating layer 400 away from the semiconductor substrate 10. Exemplarily, by the photolithography process and the etching process, a signal line (for example, an adapter lead line connected with the capacitor lead line) located in the second conductive layer 200 may be formed in the array region, and figures of a third test pad 230 and a fourth test pad 240 located in the second conductive layer 200 may be formed in the test region. Exemplarily, the second conductive layer 200 may include the third test pad 230 and the fourth test pad 240. Wherein the third test pad 230 is electrically connected to a first terminal of the second test line 120 through the first via hole 310, and the fourth test pad 240 is electrically connected to a second terminal of the second test line 120 through the second via hole 320. After the figures of the structures in the second conductive layer 200 are formed, different voltages may be loaded to the third test pad 230 and the fourth test pad 240 through the test machine, to determine resistivity of the second test line 120. As different voltages are loaded to the third test pad 230 and the fourth test pad 240, a current may be generated between the third test pad 230 and the fourth test pad 240, and the current flow through the second test line 120, such that the resistivity of the second test line 120 may be obtained according to the current.

Exemplarily, a second current flowing through the second test line 120 may be obtained by loading a third voltage to the third test pad 230 and loading a fourth voltage to the fourth test pad 240 through the test machine, wherein the third voltage is smaller than the fourth voltage. For example, the third voltage may be 0V, and the fourth voltage may be a positive value (for example, 5V). The test machine may directly read the second current. Certainly, in practical application, the specific values of the third voltage and the fourth voltage may be set according to requirements of application, without limitation here.

Thus, the resistivity ρ2 of the second test line 120 may be determined through formulas $$Rm2 = \frac{V4 - V3}{I2} \text{ and } \rho2 = \frac{Rm2 * S2}{L2}$$

according to the third voltage, the fourth voltage and the second current. Wherein Rm2 represents a second test resistance, V3 represents the third voltage, V4 represents the fourth voltage, I2 represents the second current, ρ2 represents the resistivity of the second test line 120, S2 represents a cross section area of the second test line 120, and L2 represents a length of the second test line 120. It should be noted that the cross section area and the length of the second test line 120 may be obtained according to a preparation process.

Based on a test method of the semiconductor base plate, two test pads may be arranged at the second conductive layer 200, such that the resistivity of the first test line 110 and the resistivity of the second test line 120 may be tested and obtained. Thus, the test pads of the first test line 110 may not need to be additionally set in the second conductive layer 200, such that the space occupation of a part of the second conductive layer 200 in the test region may be saved.

In the embodiments of the present disclosure, in order to prevent the first test line 110 and the second test line 120 from short circuit through the first via hole 310, referring to FIGS. 1-4B, the third test pad 230 may include a first test portion 231 and a first protrusion portion 232 electrically connected with each other, that is, the first test portion 231 and the first protrusion portion 232 are an integral structure, and form the third test pad 230. Wherein, orthographic projection of the first test portion 231 at the semiconductor substrate 10 is overlapped with orthographic projection of the first test pad 131 at the semiconductor substrate 10, such that the space increase of the test region caused by occupying an extra area by the first test portion 231 may be reduced. And, orthographic projection of the first protrusion portion 232 at the semiconductor substrate 10 is not overlapped with the orthographic projection of the first test pad 131 at the semiconductor substrate 10, and the first protrusion portion 232 is electrically connected to the first terminal of the second test line 120 through the first via hole 310. Thus, through arranging the first protrusion portion 232 protruding externally, the first via hole 310 may be far away from a region where the first test pad 131 is located, such that the third test pad 230 may be prevented from being electrically connected to the first test line 110 through the first via hole 310 as much as possible, thereby improving the correctness of the resistivity of the second test line 120 obtained by the test as much as possible.

In the embodiments of the present disclosure, referring to FIGS. 1-4B, the orthographic projection of the first protrusion portion 232 at the semiconductor substrate 10 may cover orthographic projection of the first via hole 310 at the semiconductor substrate 10. And, orthographic projection of the second test line 120 at the semiconductor substrate 10 may cover the orthographic projection of the first via hole 310 at the semiconductor substrate 10.

In the embodiments of the present disclosure, referring to FIGS. 1-4B, the orthographic projection of the first protrusion portion 232 at the semiconductor substrate 10 may cover orthographic projection of a region provided with the first via hole 310 of the second test line 120 at the semiconductor substrate 10.

Figure 3:
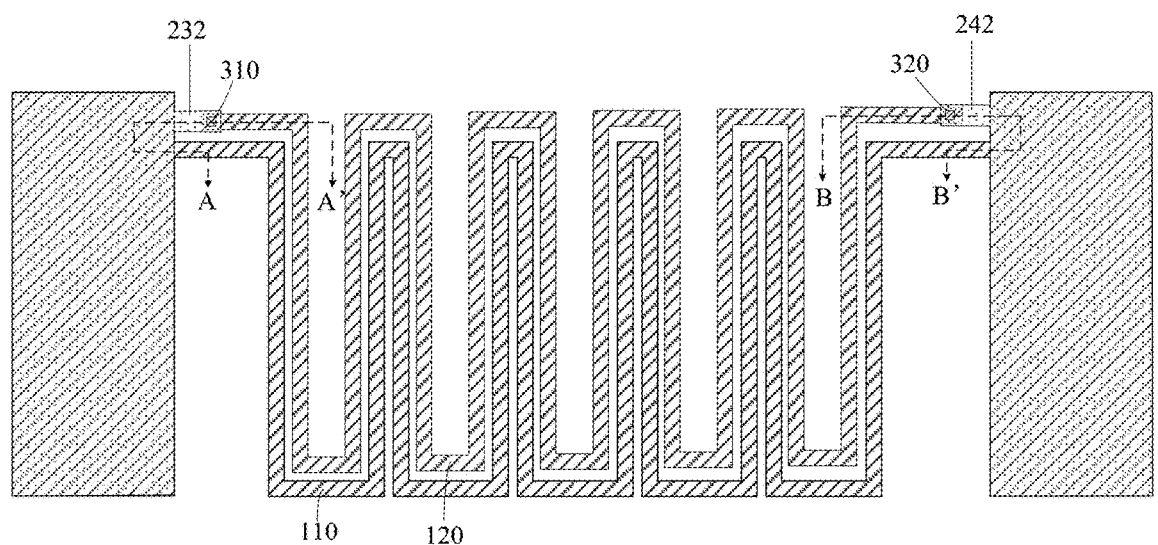
FIG. 3 is a top view structure diagram of a semiconductor base plate in the embodiments of the present disclosure.
Figure 4A:
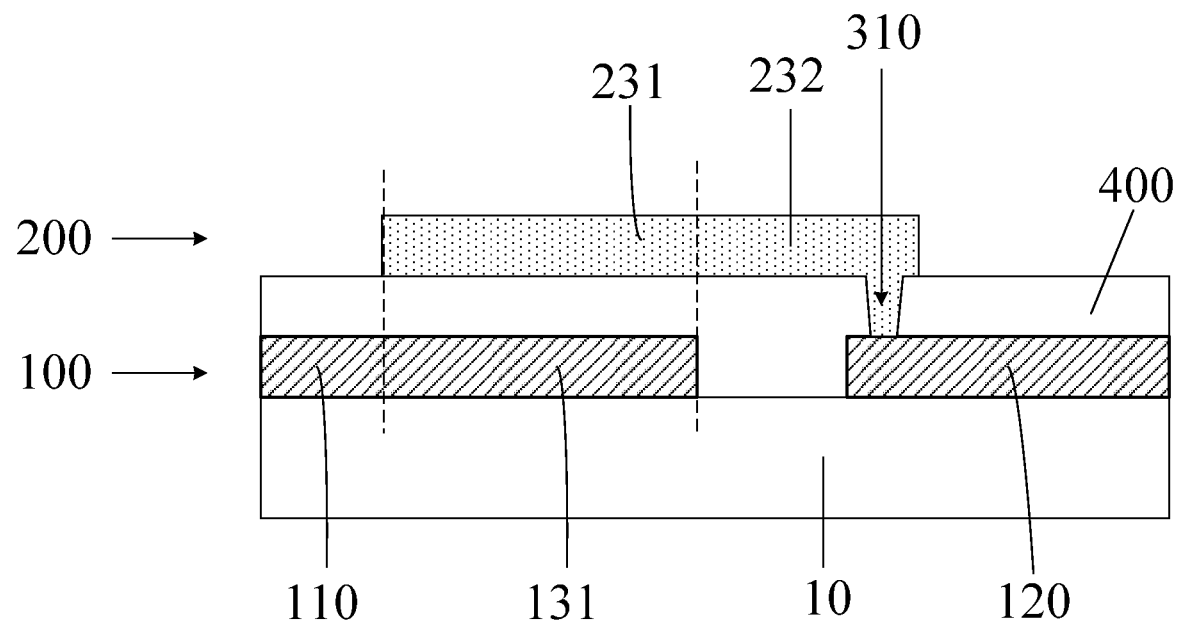
FIG. 4A is a section view structure diagram of the semiconductor base plate as shown in FIG. 3 along an AA' direction in the embodiments of the present disclosure.
Figure 4B:
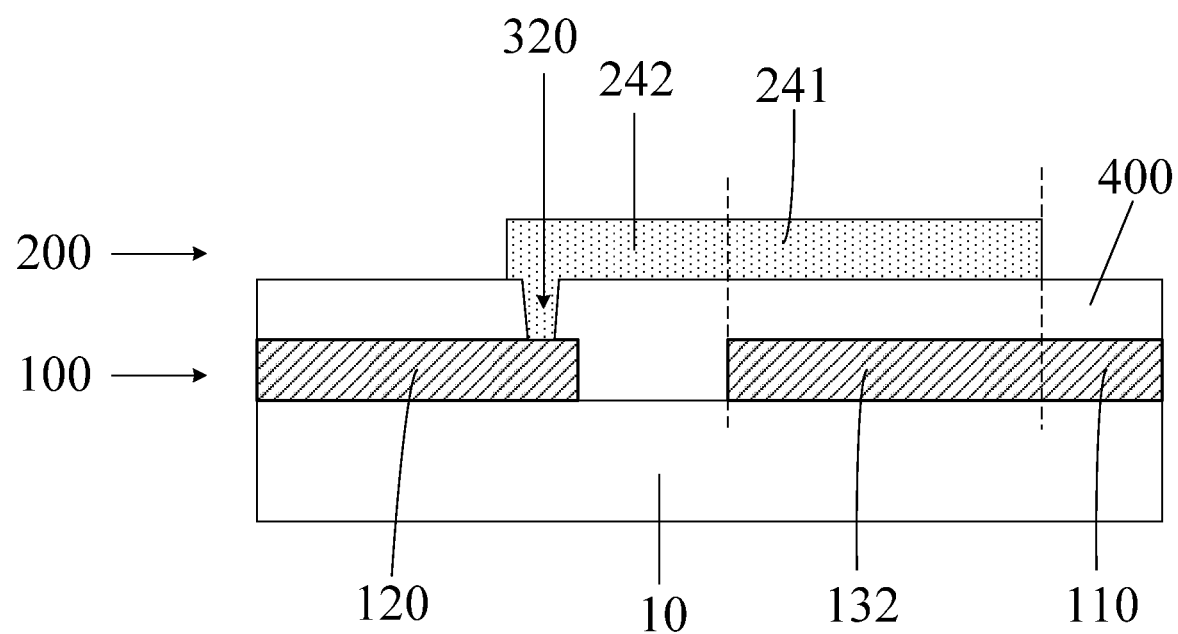
FIG. 4B is a section view structure diagram of the semiconductor base plate as shown in FIG. 3 along a BB' direction in the embodiments of the present disclosure.

In the embodiments of the present disclosure, further, in order to reduce the space increase of the test region caused by occupying the extra area by the first test portion 231, the orthographic projection of the first test portion 231 at the semiconductor substrate 10 may cover the orthographic projection of the first test pad 131 at the semiconductor substrate 10. As shown in FIG. 1, a boundary of the orthographic projection of the first test portion 231 at the semiconductor substrate 10 and a boundary of the orthographic projection of the first test pad 131 at the semiconductor substrate 10 may have a clearance with a set distance (may be determined according to requirements of practical application). As shown in FIG. 3, the boundary of the orthographic projection of the first test portion 231 at the semiconductor substrate 10 may coincide with the boundary of the orthographic projection of the first test pad 131 at the semiconductor substrate 10.

In the embodiments of the present disclosure, in order to prevent the first test line 110 and the second test line 120 from short circuit through the second via hole 320, referring to FIGS. 1-4B, the fourth test pad 240 may include a second test portion 241 and a second protrusion portion 242 electrically connected with each other, that is, the second test portion 241 and the second protrusion portion 242 are an integral structure, and form the fourth test pad 240. Wherein, orthographic projection of the second test portion 241 at the semiconductor substrate 10 is overlapped with orthographic projection of the second test pad 132 at the semiconductor substrate 10, such that space increase of the test region caused by occupying an extra area by the second test portion 241 may be reduced. And, orthographic projection of the second protrusion portion 242 at the semiconductor substrate 10 is not overlapped with the orthographic projection of the second test pad 132 at the semiconductor substrate 10, and the second protrusion portion 242 is electrically connected to the second terminal of the second test line 120 through the second via hole 320. Thus, through arranging the second protrusion portion 242 protruding externally, the second via hole 320 may be far away from a region where the second test pad 132 is located, such that the third test pad 230 may be prevented from being electrically connected to the first test line 110 through the first via hole 310 as much as possible, thereby improving the correctness of the resistivity of the second test line 120 obtained by the tested as much as possible.

In the embodiments of the present disclosure, referring to FIGS. 1-4B, the orthographic projection of the second protrusion portion 242 at the semiconductor substrate 10 may cover orthographic projection of the second via hole 320 at the semiconductor substrate 10. And, the orthographic projection of the second test line 120 at the semiconductor substrate 10 may cover the orthographic projection of the second via hole 320 at the semiconductor substrate 10.

In the embodiments of the present disclosure, referring to FIGS. 1-4B, the orthographic projection of the second protrusion portion 242 at the semiconductor substrate 10 may cover orthographic projection of a region provided with the second via hole 320 of the second test line 120 at the semiconductor substrate 10.

In the embodiments of the present disclosure, further, in order to reduce the space increase of the test region caused by occupying the extra area by the second test portion 241, the orthographic projection of the second test portion 241 at the semiconductor substrate 10 may cover the orthographic projection of the second test pad 132 at the semiconductor substrate 10. As shown in FIG. 1, a boundary of the orthographic projection of the second test portion 241 at the semiconductor substrate 10 and a boundary of the orthographic projection of the second test pad 132 at the semiconductor substrate 10 may have a clearance with a set distance (may be determined according to requirements of practical application). As shown in FIG. 3, the boundary of the orthographic projection of the second test portion 241 at the semiconductor substrate 10 may coincide with the boundary of the orthographic projection of the second test pad 132 at the semiconductor substrate 10.

Apparently, persons skilled in the art can make various changes and modifications to the present disclosure without departing from the spirit and scope of the present disclosure. In this way, if these changes and modifications to the present disclosure fall within the scope of the claims of the present disclosure and equivalent technologies thereof, the present disclosure is further intended to include these changes and modifications.

The invention claimed is:

1. A semiconductor base plate, comprising:
a semiconductor substrate, comprising a test region;
a first conductive layer, located in the test region of the semiconductor substrate, wherein the first conductive layer comprises a first test structure and a second test line arranged at intervals from each other; and the first test structure comprises a first test pad and a second test pad arranged at intervals, and a first test line electrically connected between the first test pad and the second test pad;
a first insulating layer, located on a side of the first conductive layer away from the semiconductor substrate; and
a second conductive layer, located on a side of the first insulating layer away from the semiconductor substrate, wherein the second conductive layer comprises a third test pad and a fourth test pad;
wherein the third test pad is electrically connected to a first terminal of the second test line through a first via hole, and the fourth test pad is electrically connected to a second terminal of the second test line through a second via hole;
the first via hole and the second via hole penetrate the first insulating layer; and
the third test pad comprises a first test portion and a first protrusion portion electrically connected with the first test portion, wherein an orthographic projection of the first test portion at the semiconductor substrate is overlapped with an orthographic projection of the first test pad at the semiconductor substrate; an orthographic projection of the first protrusion portion at the semiconductor substrate is not overlapped with the orthographic projection of the first test pad at the semiconductor substrate; and the first protrusion portion is electrically connected to the first terminal of the second test line through the first via hole.

2. The semiconductor base plate of claim 1, wherein the orthographic projection of the first test portion at the semiconductor substrate covers the orthographic projection of the first test pad at the semiconductor substrate.

3. The semiconductor base plate of claim 1, wherein a boundary of the orthographic projection of the first test portion at the semiconductor substrate coincides with a boundary of the orthographic projection of the first test pad at the semiconductor substrate.

4. The semiconductor base plate of claim 1, wherein the orthographic projection of the first protrusion portion at the semiconductor substrate covers an orthographic projection of a region provided with the first via hole of the second test line at the semiconductor substrate.

5. The semiconductor base plate of claim 1, wherein the fourth test pad comprises a second test portion and a second protrusion portion electrically connected with the second test portion, wherein an orthographic projection of the second test portion at the semiconductor substrate is overlapped with an orthographic projection of the second test pad at the semiconductor substrate; and an orthographic projection of the second protrusion portion at the semiconductor substrate is not overlapped with the orthographic projection of the second test pad at the semiconductor substrate; and
the second protrusion portion is electrically connected to the second terminal of the second test line through the second via hole.

6. The semiconductor base plate of claim 5, wherein the orthographic projection of the second test portion at the semiconductor substrate covers the orthographic projection of the second test pad at the semiconductor substrate.

7. The semiconductor base plate of claim 2, wherein a boundary of the orthographic projection of the second test portion at the semiconductor substrate coincides with a boundary of the orthographic projection of the second test pad at the semiconductor substrate.

8. The semiconductor base plate of claim 2, wherein the orthographic projection of the second protrusion portion at the semiconductor substrate covers an orthographic projection of a region provided with the second via hole of the second test line at the semiconductor substrate.

9. A method of testing a semiconductor base plate, wherein the semiconductor base plate comprises:
a semiconductor substrate, comprising a test region;
a first conductive layer, located in the test region of the semiconductor substrate, wherein the first conductive layer comprises a first test structure and a second test line arranged at intervals from each other; and the first test structure comprises a first test pad and a second test pad arranged at intervals, and a first test line electrically connected between the first test pad and the second test pad;
a first insulating layer, located on a side of the first conductive layer away from the semiconductor substrate; and
a second conductive layer, located on a side of the first insulating layer away from the semiconductor substrate, wherein the second conductive layer comprises a third test pad and a fourth test pad;
wherein the third test pad is electrically connected to a first terminal of the second test line through a first via hole, and the fourth test pad is electrically connected to a second terminal of the second test line through a second via hole; the first via hole and the second via hole penetrate the first insulating layer; the third test pad comprises a first test portion and a first protrusion portion electrically connected with the first test portion; an orthographic projection of the first test portion at the semiconductor substrate is overlapped with an orthographic projection of the first test pad at the semiconductor substrate; an orthographic projection of the first protrusion portion at the semiconductor substrate is not overlapped with the orthographic projection of the first test pad at the semiconductor substrate; and the first protrusion portion is electrically connected to the first terminal of the second test line through the first via hole; and wherein the method comprises:

determining a resistivity of the first test line by loading different voltages to the first test pad and the second test pad through a test machine after forming the first conductive layer in the test region of the semiconductor substrate, and before forming the first insulating layer in the test region of the semiconductor substrate; and determining a resistivity of the second test line by loading different voltages to the third test pad and the fourth test pad through the test machine after forming the second conductive layer in the test region of the semiconductor substrate.

10. The method of testing the semiconductor base plate of claim 9, wherein the determining the resistivity of the first test line by loading the different voltages to the first test pad and the second test pad through the test machine comprises:

loading a first voltage to the first test pad and loading a second voltage to the second test pad through the test machine, and obtaining a first current flowing through the first test line, wherein the first voltage is smaller than the second voltage; and determining the resistivity of the first test line according to the first voltage, the second voltage and the first current.

11. The method of testing the semiconductor base plate of claim 10, wherein the determining the resistivity of the first test line according to the first voltage, the second voltage and the first current comprises:

determining the resistivity of the first test line according to the following formulas:

$$Rm1 = \frac{V2 - V1}{I1};$$

$$\rho1 = \frac{Rm1 * S1}{L1};$$

wherein, Rm1 represents a first test resistance, V1 represents the first voltage, V2 represents the second voltage, I1 represents the first current, ρ1 represents the resistivity of the first test line, S1 represents a cross section area of the first test line, and L1 represents a length of the first test line.

12. The method of testing the semiconductor base plate of claim 9, wherein the determining the resistivity of the second test line by loading the different voltages to the third test pad and the fourth test pad through the test machine comprises:

loading a third voltage to the third test pad and loading a fourth voltage to the fourth test pad through the test machine, and obtaining a second current flowing through the second test line, wherein the third voltage is smaller than the fourth voltage; and determining the resistivity of the second test line according to the third voltage, the fourth voltage and the second current.

13. The method of testing the semiconductor base plate of claim 12, wherein the determining the resistivity of the second test line according to the third voltage, the fourth voltage and the second current comprises:

determining the resistivity of the second test line according to the following formulas:

$$Rm2 = \frac{V4 - V3}{I2};$$

$$\rho2 = \frac{Rm2 * S2}{L2};$$

wherein, Rm2 represents a second test resistance, V3 represents the third voltage, V4 represents the fourth voltage, I2 represents the second current, ρ2 represents the resistivity of the second test line, S2 represents a cross section area of the second test line, and L2 represents a length of the second test line.

* * * * *